United States Patent
Tak et al.

(10) Patent No.: US 11,201,214 B2
(45) Date of Patent: Dec. 14, 2021

(54) SEMICONDUCTOR DEVICE AND MANUFACTURING METHOD OF THE SEMICONDUCTOR DEVICE

(71) Applicants: SK hynix Inc., Icheon (KR); INDUSTRY-ACADEMIC COOPERATION FOUNDATION, YONSEI UNIVERSITY, Seoul (KR)

(72) Inventors: Young Jun Tak, Cheonan (KR); Tae Soo Jung, Seoul (KR); Won Gi Kim, Goyang (KR)

(73) Assignees: SK hynix Inc., Icheon (KR); Industry-Academic Cooperation Foundation, Yonsei University, Seoul (KR)

( * ) Notice: Subject to any disclaimer, the term of this patent is extended or adjusted under 35 U.S.C. 154(b) by 104 days.

(21) Appl. No.: 16/840,207

(22) Filed: Apr. 3, 2020

(65) Prior Publication Data

US 2021/0066458 A1    Mar. 4, 2021

(30) Foreign Application Priority Data

Aug. 26, 2019 (KR) .................. 10-2019-0104670

(51) Int. Cl.
*H01L 29/10* (2006.01)
(52) U.S. Cl.
CPC ................ *H01L 29/1054* (2013.01)
(58) Field of Classification Search
CPC ........... H01L 29/1054; H01L 29/40117; H01L 29/7788; H01L 27/249; H01L 27/11556
See application file for complete search history.

(56) References Cited

U.S. PATENT DOCUMENTS

| | | |
|---|---|---|
| 8,368,067 B2 | 2/2013 | Uchiyama et al. |
| 8,613,798 B2 | 12/2013 | Lee et al. |
| 9,449,816 B2 | 9/2016 | Aria et al. |
| 9,449,985 B1 | 9/2016 | Rabkin et al. |
| 9,634,097 B2 | 4/2017 | Rabkin et al. |
| 9,780,228 B2 | 10/2017 | Kim et al. |
| 10,985,172 B2 * | 4/2021 | Ge .................. H01L 29/78391 |

(Continued)

FOREIGN PATENT DOCUMENTS

| | | |
|---|---|---|
| JP | 4724723 B2 | 7/2011 |
| JP | 2017-0059607 | 3/2017 |

(Continued)

OTHER PUBLICATIONS

Simone Bertolazzi et al., "Nonvolatile Memory Cells Based on MoS2/Graphene Heterostructures", ACS Nano, 2013, pp. 3246-3252s, vol. 7, No. 4.

(Continued)

*Primary Examiner* — Changhyun Yi

(57) ABSTRACT

A semiconductor device includes a stack structure including conductive layers and insulating layers that are alternately stacked with each other, a first channel layer passing through the stack structure and including a metal oxide-based semiconductor, and a second channel layer adjacent to the first channel layer and including the metal oxide-based semiconductor, wherein the first channel layer has a higher oxygen content than the second channel layer and has a different thickness from the second channel layer.

23 Claims, 13 Drawing Sheets

(56) References Cited

U.S. PATENT DOCUMENTS

| | | | |
|---|---|---|---|
| 2003/0113962 A1 | 6/2003 | Chindalore et al. | |
| 2013/0161611 A1 | 6/2013 | Yamazaki et al. | |
| 2016/0118391 A1* | 4/2016 | Zhao | H01L 29/16 257/66 |
| 2018/0040627 A1* | 2/2018 | Kanakamedala | H01L 27/11529 |
| 2018/0374865 A1* | 12/2018 | Shimabukuro | H01L 29/66553 |

FOREIGN PATENT DOCUMENTS

| | | | |
|---|---|---|---|
| JP | 2019024087 A | 2/2019 | |
| KR | 20090079513 A | 7/2009 | |
| KR | 20120054660 A | 5/2012 | |
| KR | 10-2013-0077116 | 7/2013 | |
| KR | 10-1451928 B1 | 10/2014 | |
| KR | 10-2015-0038279 | 4/2015 | |
| KR | 20160017840 A | 2/2016 | |
| KR | 10-2017-0093065 | 8/2017 | |
| KR | 20190006372 A | 1/2019 | |
| KR | 20190053301 A | 5/2019 | |
| KR | 20190069058 A | 6/2019 | |
| WO | WO2011055433 A1 | 5/2011 | |

OTHER PUBLICATIONS

Augustin J. Hong et al., "Graphene Flash Memory", ACS Nano, 2011, pp. 7812-7817, vol. 5, No. 10.

Kenji Nomura et al., "Room-temperature fabrication of transparent flexible thin-film transistors using amorphous oxide semiconductors", Nature, Nov. 25, 2004, pp. 488-492, vol. 432.

Shunpei Yamazaki, "New crystalline structure yields reliable thin-film transistors", SPIE, 2012.

Shuhei Nagatsuka et al., "A 3bit/cell nonvolatile memory with crystalline ln-Ga—Zn—O TFT", IEEE, 2013.

You Seung Rim et al., "Boost Up Mobility of Solution-Processed Metal Oxide Thin-Film Transistors via Confining Structure on Electron Pathways", Advanced Materials, Apr. 17, 2014, pp. 4273-4278, No. 26.

Jae Won Na et al., "Silicon Cations Intermixed Indium Zinc Oxide Interface for High-Performance Thin-Film Transistors Using a Solution Process", Applied Materials & Interfaces, Aug. 16, 2017, pp. 29849-29856, No. 9.

Seung Jin Heo et al., "Modification of hybrid active bilayer for enhanced efficiency and stability in planar heterojunction colloidal quantum dot photovoltaics", Nanoscale Research Letters, 2013.

Sung Pyo Park et al., "Highly reliable switching via phase transition using hydrogen peroxide in homogeneous and multi-layered GaZnOx-based resistive random access memory devices", The Royal Society of Chemistry, 2015, pp. 9173-9176, No. 51.

Ji Hoon Park et al., "Simple method to enhance positive bias stress stability of ln—Ga—Zn—O thin-film transistors using a vertically graded oxygen-vacancy active layer", Applied Materials & Interfaces, 2014, pp. 21363-21368, No. 6.

Young Jun Tak et al., "Modified Stoichiometry in Homogeneous Indium-Zinc Oxide System as Vertically Graded Oxygen Deficiencies by Controlling Redox Reactions", Applied Materials & Interfaces, 2016, No. 3.

Seokhyun Yoon et al., "A solution-processed quaternary oxide system obtained at low-temperature using a vertical diffusion technique", Scientific Reports, Feb. 23, 2017.

C. Tanase et al., "Local charge carrier mobility in disordered organic field-effect transistors", Organic electronics, 2003, pp. 33-37, No. 4.

* cited by examiner

● M2　○ M1

M1-rich

M2-rich

● M2
○ M1

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean Patent Application Number 10-2019-0104670, filed on Aug. 26, 2019, in the Korean Intellectual Property Office, the entire disclosure of which is incorporated herein by reference.

BACKGROUND

Field of Invention

Various embodiments of the present disclosure relate to an electronic device, and more particularly, to a semiconductor device and a manufacturing method thereof.

Description of Related Art

Non-volatile memory devices retain stored data even in the absence of a power supply. The increase in integration density of two-dimensional non-volatile memory devices in which memory cells are formed in a single layer over a substrate has recently been limited. Thus, three-dimensional non-volatile memory devices in which memory cells are stacked in a vertical direction over a substrate have been proposed.

A three-dimensional non-volatile memory device includes interlayer insulating layers and gate electrodes stacked alternately with each other, and channel layers passing therethrough, and memory cells are stacked along the channel layers. Various structures and manufacturing methods have been developed to improve the operational reliability of three-dimensional non-volatile memory devices.

SUMMARY

Various embodiments are directed to a semiconductor device with easy manufacturing processes, a stabilized structure, and improved characteristics, and a manufacturing method thereof.

According to an embodiment, a semiconductor device may include a stack structure including conductive layers and insulating layers that are alternately stacked with each other, a first channel layer passing through the stack structure and including a metal oxide-based semiconductor, and a second channel layer adjacent to the first channel layer and including the metal oxide-based semiconductor, wherein the first channel layer has a higher oxygen content than the second channel layer and has a different thickness from the second channel layer.

According to an embodiment, a method of manufacturing a semiconductor device may include forming a stack structure including first material layers and second material layers that are alternately stacked with each other, forming an opening passing through the stack structure, forming a first channel layer including a metal oxide-based semiconductor in the opening, and forming a second channel layer including the metal oxide-based semiconductor in the first channel layer, wherein the first channel layer has a higher oxygen content than and a different thickness from the second channel layer.

According to an embodiment, a semiconductor device may include a stack structure including conductive layers and insulating layers that are alternately stacked with each other, a channel layer passing through the stack structure, a tunnel insulating layer interposed between the channel layer and the stack structure and including a metal oxide that includes a first metal and a second metal having different magnetic strengths, and a data storage layer interposed between the tunnel insulating layer and the stack structure, wherein the tunnel insulating layer is a single layer including an inner side portion adjacent to the channel layer and an outer side portion adjacent to the data storage layer, and wherein the outer side portion has a higher concentration of the first metal than the inner side portion and the inner side portion has a higher concentration of the second metal than the outer side portion.

According to an embodiment, a method of manufacturing a semiconductor device may include forming a stack structure including conductive layers and insulating layers that are alternately stacked with each other, forming an opening passing through the stack structure, forming a tunnel insulating layer in the opening, the tunnel insulating layer including a metal oxide with a first metal and a second metal with a different magnetic strength from the first metal, and forming a channel layer in the tunnel insulating layer, wherein the tunnel insulating layer is a single layer including an inner side portion adjacent to the channel layer and an outer side portion adjacent to the stack structure, and wherein the outer side portion has a higher concentration of the first metal than the inner side portion and the inner side portion has a higher concentration of the second metal than the outer side portion.

DETAILED DESCRIPTION

Figure 1A:
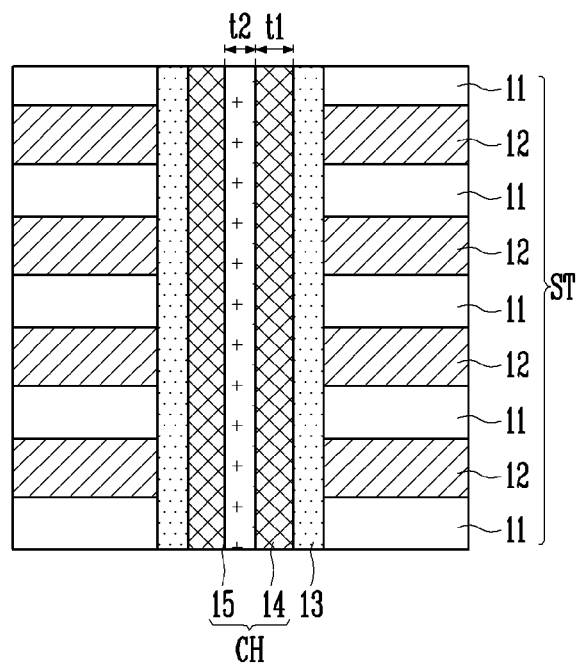
FIGS. 1A and 1B are cross-sectional diagrams illustrating the structure of a semiconductor device according to an embodiment of the present disclosure.

Hereinafter, various exemplary embodiments will be described in detail with reference to the accompanying drawings. In the drawings, thicknesses and distances of components may be exaggerated compared to the actual physical thicknesses and distances for convenience of illustration. In the following description, a detailed description of known related functions and constitutions may be omitted for simplicity and conciseness. Like reference numerals refer to like elements throughout the specification and drawings.

It is also noted that in this specification, "connected/coupled" refers to one component not only "directly connected/coupled" to another component but also "indirectly connected/coupled" to another component through an intervening component. In the specification, when an element is referred to as "comprising" or "including" a component, it does not exclude other components but may further include other components unless a description to the contrary is specifically pointed out in context.

Figure 1B:
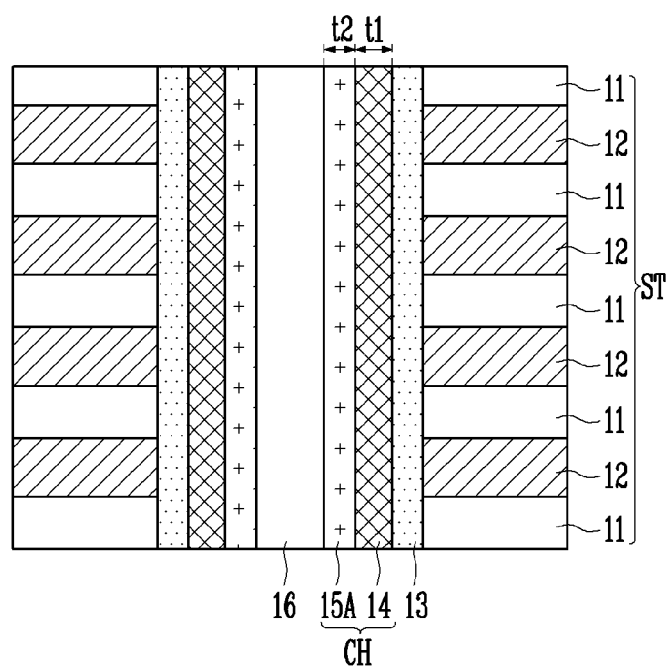

FIGS. 1A and 1B are cross-sectional diagrams illustrating the structure of a semiconductor device according to an embodiment of the present disclosure.

Referring to FIGS. 1A and 1B, a semiconductor device according to an embodiment of the present disclosure may include a stack structure ST, a memory layer 13, and a channel structure CH.

The stack structure ST may include conductive layers 11 and insulating layers 12 alternately stacked with each other. The conductive layers 11 may be gate electrodes of a select transistor, a memory cell, or the like, and may include polysilicon, tungsten, metal, or the like. The insulating layers 12 may be provided to insulate the stacked gate electrodes from each other and may include an insulating material such as an oxide or a nitride.

The memory layer 13 and the channel structure CH may pass through the stack structure ST in a stacking direction. The stacking direction may be a direction in which the conductive layers 11 and the insulating layers 12 are stacked, and a direction perpendicular to a surface of the substrate.

The memory layer 13 may include at least one of a tunnel insulating layer, a data storage layer, and a charge blocking layer. In an embodiment, a tunnel insulating layer of a memory layer 13 surrounds a first channel layer 14, a data storage layer surrounds the tunnel insulating layer, and a charge blocking layer surrounds the data storage layer. The data storage layer may include a floating gate, a charge trapping material, silicon, a nitride, nanodots, a variable resistance material, a phase change material, and the like. The tunnel insulating layer may include a metal oxide, and the metal oxide may include first metal and second metal having different magnetic properties from each other. For example, the metals may have different magnetic strengths, e.g. different Gauss values.

The channel structure CH may be a region in which a channel, such as a select transistor or a memory cell, is formed. Select transistors or memory cells may be located in intersections of the channel structure CH and the conductive layers 11.

Referring to Table 1, a material of the channel structure CH may be determined considering one or more of carrier mobility, bandgap controllability, a phase, reliability, and an off current.

TABLE 1

| Type | Mobility | Bandgap controllability | Phase | Reliability | Off current |
|------|----------|------------------------|-----------|-------------|-------------|
| IZO  | ○        | ○                      | amorphous | Δ           | ○           |
| ZTO  | ○        | ○                      | amorphous | Δ           | ○           |
| IGZO | Δ        | ⊚                      | amorphous | ○           | ○           |
| ITZO | ⊚        | ⊚                      | amorphous | Δ           | Δ           |

A material having an amorphous phase may be selected as a material of the channel structure CH, which may prevent generating a charge trap at grain boundaries of a crystal phase. In addition, poly agglomeration from high temperature processes may be prevented. Accordingly, thin film uniformity may be increased when the channel structure comprises an amorphous material.

A material having good carrier mobility and reliability, and off current characteristics may be used in the channel structure CH. Accordingly, a transistor with excellent mobility and low power consumption may be implemented. In addition, a material capable of adjusting the bandgap may be selected as a material of the channel structure CH. Carrier mobility may be improved and a leakage current may be reduced by partially increasing carrier concentration in the channel structure CH.

Considering the features described above, the channel structure CH may include a metal oxide-based semiconductor such as Indium Zinc Oxide (IZO), Zinc Tin Oxide (ZTO), Indium Gallium Zinc Oxide (IGZO), Indium Tin Zinc Oxide (ITZO), or a combination thereof.

The channel structure CH may be a multilayer film and may include the first channel layer 14 and a second channel layer 15 or 15A. The first channel layer 14 may pass through the stack structure ST and may have a shape in which a central region thereof is opened. For example, the first channel layer 14 may have a hollow cylindrical or tubular shape. The second channel layer 15 or 15A may pass through the stack structure ST and may be formed in the first channel layer 14. The second channel layer 15 or 15A may be adjacent to the first channel layer 14. The first channel layer 14 and the second channel layer 15 or 15A are formed by separate processes and an interface may be present between the first channel layer 14 and the second channel layer 15 or 15A.

Referring to FIG. 1A, the second channel layer 15 may have a full solid shape. In another embodiment, referring to FIG. 1B, the second channel layer 15A may have a hollow or tubular shape with an open center. A gap-fill insulating layer 16 may be formed in the second channel layer 15A. The gap-fill insulating layer 16 may be disposed in the open center of the second channel layer 15A.

At least one of oxygen content, thickness, and metal composition of the first and second channel layers 14, 15, and 15A may be configured to partially increase carrier concentration in the channel structure CH. For example, oxygen content, thickness and metal composition of the first and second channel layers 14, 15, and 15A may be configured or adjusted relative to one another to optimize a carrier concentration.

Referring to FIGS. 1A and 1B, an oxygen content of the first channel layer 14 and an oxygen content of the second channel layer 15 or 15A may be different from each other. For example, the first channel layer 14 may have a higher oxygen content than the second channel layer 15 or 15A. In other words, the first channel layer 14 may have less oxygen vacancies than the second channel layer 15 or 15A.

The first channel layer 14 may have a thickness t1 different from a thickness t2 of the second channel layer 15 or 15A (t1≠t2). For example, the second channel layer 15 or 15A may have the thickness t2 smaller than the thickness t1 of the first channel layer 14 (t2<t1). In an embodiment, the second channel layer 15 or 15A may have the thickness t2 less than or equal to 5 nm.

In addition, the first channel layer 14 may have a metal composition different from a metal composition of the second channel layer 15 or 15A. For example, the first channel layer 14 may have a higher concentration of indium (In), a higher concentration of tin (Sn), or a lower concentration of gallium (Ga) than the second channel layer 15 or 15A.

According to the structures described above, carriers may be concentrated at a boundary of the first channel layer 14 and the second channel layer 15 or 15A by adjusting at least one of oxygen contents, thicknesses, and metal compositions of the first and second channel layers 14, 15, and 15A.

Figure 2A:
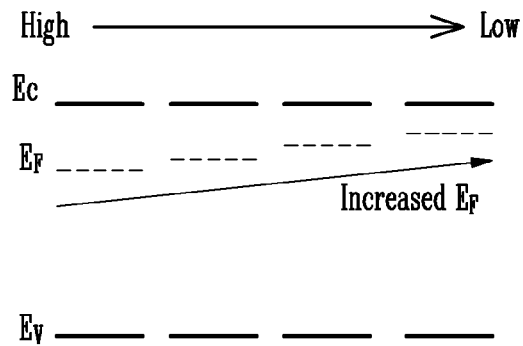
FIGS. 2A to 2C are diagrams illustrating characteristics of a channel structure according to an embodiment of the present disclosure.
Figure 2B:
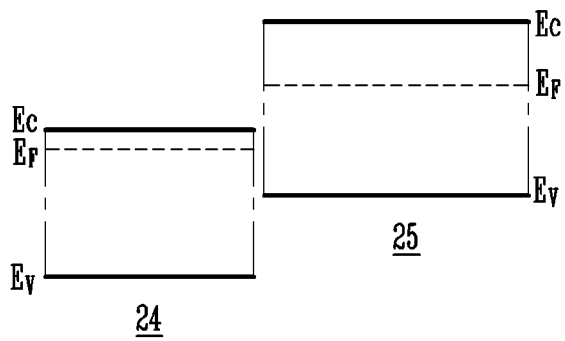
Figure 2C:
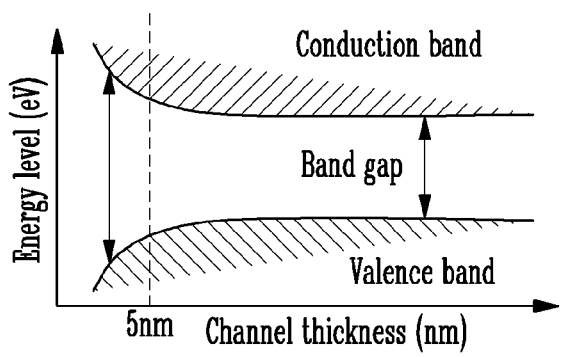

FIGS. 2A to 2C are diagrams illustrating characteristics of a channel structure according to an embodiment of the present disclosure.

FIG. 2A illustrates a level of Fermi energy according to a high or low oxygen content. FIG. 2B illustrates an energy band diagram of a first channel layer 24 and a second channel layer 25 having different oxygen contents from each other. Reference character $E_C$ denotes the lowest energy level of a conduction band, reference character $E_V$ denotes the highest energy level of a valence band, and reference character $E_F$ denotes a level of Fermi energy. In addition, the first channel layer 24 and the second channel layer 25 may have a structure similar to the embodiments described with reference to FIGS. 1A and 1B. The second channel layer 25 may be located in the first channel layer 24 and the first channel layer 24 may be located to be adjacent to a memory layer.

Referring to FIG. 2A, a level of Fermi energy $E_F$ may be great when an oxygen content is low. In other words, the level of Fermi energy $E_F$ may be great when the number of oxygen vacancies is great. Referring to FIG. 2B, when the first channel layer 24 has a higher oxygen content than the second channel layer 25, the first channel layer 24 may have a lower level of Fermi energy $E_F$ than the second channel layer 25. In other words, when the number of oxygen vacancies in the first channel layer 24 is smaller than the number of oxygen vacancies in the second channel layer 25, the first channel layer 24 may have a lower level of Fermi energy $E_F$ than the second channel layer 25.

FIG. 2C illustrates how characteristics of a channel layer vary according to thickness. Referring to FIG. 2C, bandgap energy of a channel layer may vary according to the layer's thickness. Accordingly, the second channel layer 25 and the first channel layer 24 may have different thicknesses from each other such that the second channel layer 25 and the first channel layer 24 have different bandgap energy from each other.

Referring to the graph of FIG. 2C, a channel layer having a small thickness may have a relatively high bandgap energy relative to a channel layer having a great thickness. Accordingly, bandgap energy of the second channel layer 25 may be increased by decreasing a thickness of the second channel layer 25. For example, the second channel layer 25 may have a smaller thickness than the first channel layer 24 such that the first channel layer 24 has relatively small bandgap energy compared to the second channel layer 25.

In addition, FIG. 2C shows that bandgap energy sharply increases at a thickness less than or equal to 5 nm. Accordingly, the second channel layer 25 may have a thickness less than or equal to 5 nm or a thickness between 1 nm and 5 nm to increase bandgap energy.

In addition, a metal composition of a channel layer may affect the carrier mobility. For example, when a concentration of indium (In) or tin (Sn) is great, the carrier mobility is great and when a concentration of gallium (Ga) is great, the carrier mobility is small. Accordingly, a concentration of indium (In), tin (Sn), or gallium (Ga) included in the first channel layer 24 and a concentration of indium (In), tin (Sn), or gallium (Ga) included in the second channel layer 25 may be different from each other. The first channel layer 14 may have a higher concentration of indium (In), a higher concentration of tin (Sn), or a lower concentration of gallium (Ga) than the second channel layer 15 or 15A. According to the metal compositions described above, the first channel layer 14 may have greater carrier mobility than the second channel layer 15 or 15A.

According to an embodiment, the first and second channel layers 14, 15, and 15A may include Indium Zinc Oxide (IZO), in which case the first channel layer 14 may have a higher concentration of indium (In) than the second channel layer 15 or 15A. According to an embodiment, the first and second channel layers 14, 15, and 15A may include Zinc Tin Oxide (ZTO), in which case the first channel layer 14 may have a higher concentration of tin (Sn) than the second channel layer 15 or 15A. According to an embodiment, the first and second channel layers 14, 15, and 15A may include Indium Gallium Zinc Oxide (IGZO), in which case the first channel layer 14 may have a higher concentration of indium (In) or a lower concentration of gallium (Ga) than the second channel layer 15 or 15A. According to an embodiment, the first and second channel layers 14, 15, and 15A may include Indium Tin Zinc Oxide (ITZO), in which case the first channel layer 14 may have a higher concentration of indium (In) or a higher concentration of tin (Sn) than the second channel layer 15 or 15A.

At least one of oxygen content, thickness, and metal composition of the first and second channel layers 24 and 25 may be configured considering the characteristics described above. Accordingly, a channel structure may be implemented such that the first channel layer 24 has a lower level of Fermi energy, lower bandgap energy, and greater carrier mobility than the second channel layer 25. Accordingly, electron flow may be restricted to an interface between the first channel layer 24 and the second channel layer 25.

Figure 3A:
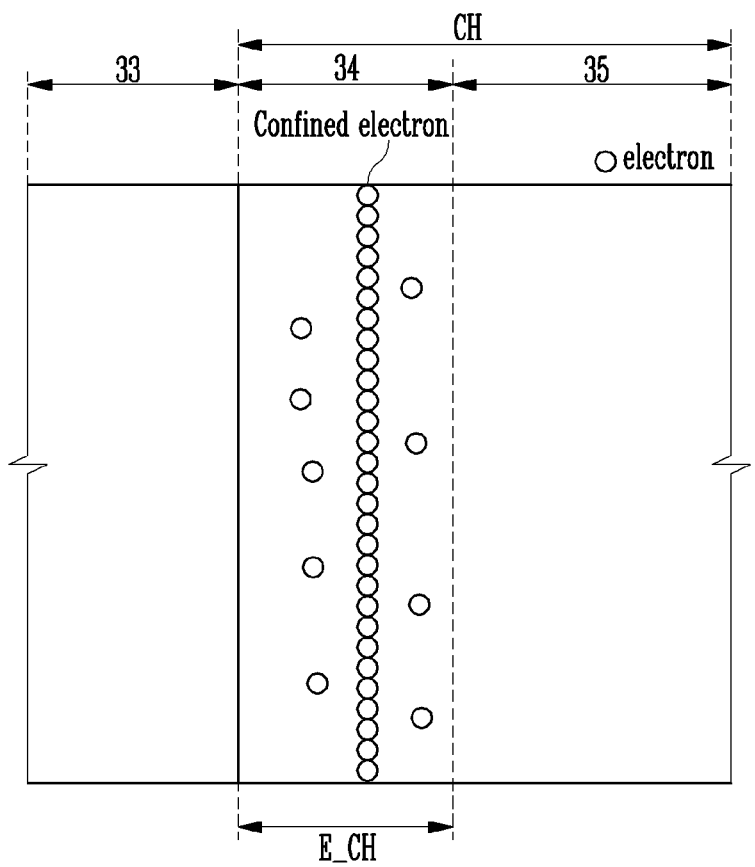
FIGS. 3A and 3B are diagrams illustrating the structure and operating principles of a semiconductor device according to an embodiment of the present disclosure.
Figure 3B:
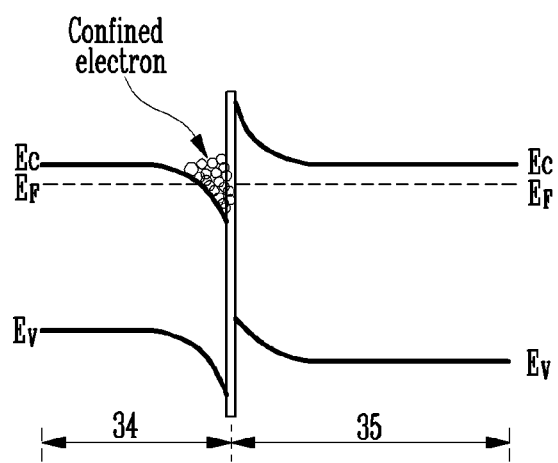

FIGS. 3A and 3B are diagrams illustrating a structure and operating principles of a semiconductor device according to an embodiment of the present disclosure. FIG. 3A is a mimetic diagram illustrating an effective channel in a channel structure. FIG. 3B is an energy band diagram of a channel structure.

Referring to FIG. 3A, a semiconductor device according to an embodiment of the present disclosure may include a memory layer 33 and a channel structure CH, and the channel structure CH may include a first channel layer 34 and a second channel layer 35. The first channel layer 34 may be in contact with the memory layer 33, and more particularly, in contact with a tunnel insulating layer of a multilayer film included in the memory layer 33.

When a transistor such as a memory cell or a select transistor is driven, carriers may move through the channel structure CH. A carrier may vary depending on a material of the channel structure CH, and may be an electron or a hole. The carriers may move within an effective channel E_CH, and the mobility of a channel may be decreased when carriers disperse farther.

Accordingly, at least one of oxygen content, thickness, and metal composition of the first and second channel layers 34 and 35 may be adjusted according to an embodiment of the present disclosure. Referring to FIG. 3B, the first channel layer 34 and the second channel layer 35 may have an energy band diagram which is newly aligned in an interface.

According to the newly aligned energy band diagram, a well may be formed between a conduction band of the first channel layer 34 and a conduction band of the second channel layer 35 and a concentration of carriers within the well may be increased. Accordingly, conductivity of the channel structure CH may be partially controlled. In addition, the channel structure CH in which an interface between the first channel layer 34 and the second channel layer 35 has greater conductivity than a remaining region may be implemented by using the features described above.

According to the embodiment described above, a carrier transfer path may be restricted to the interface between the first channel layer 34 and the second channel layer 35. The carrier may be an electron. Accordingly, current flow may be restricted to the interface between the first channel layer 34 and the second channel layer 35. In addition, carrier mobility of the channel structure CH may be increased and power consumption may be reduced.

Figure 4A:
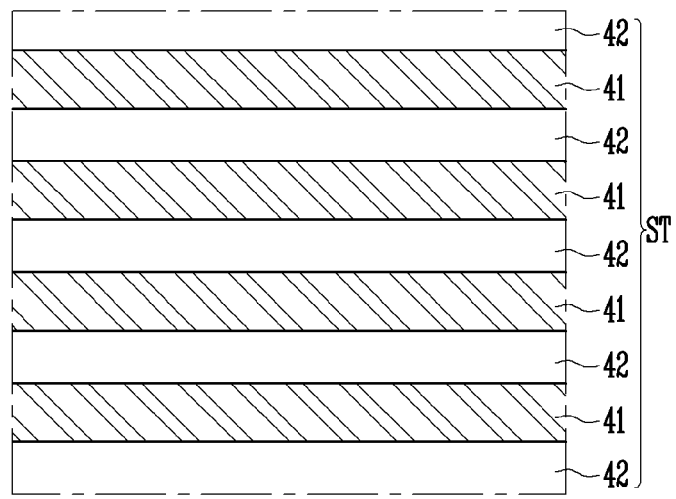
FIGS. 4A to 4C are diagrams illustrating a method of manufacturing a semiconductor device according to an embodiment of the present disclosure.
Figure 4B:
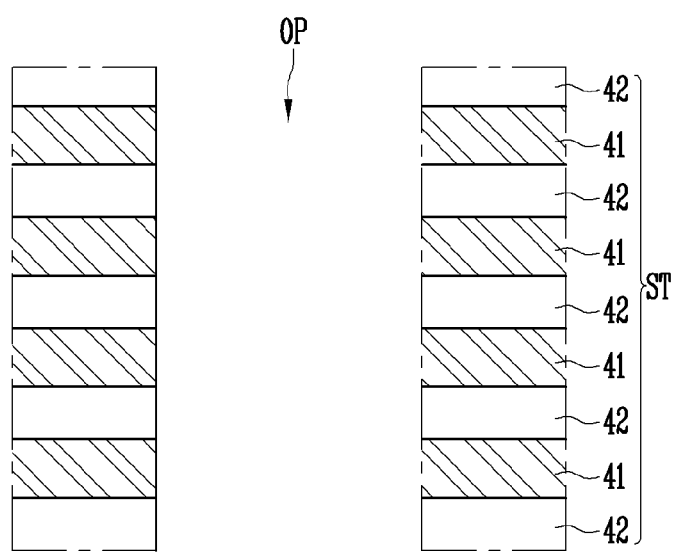
Figure 4C:
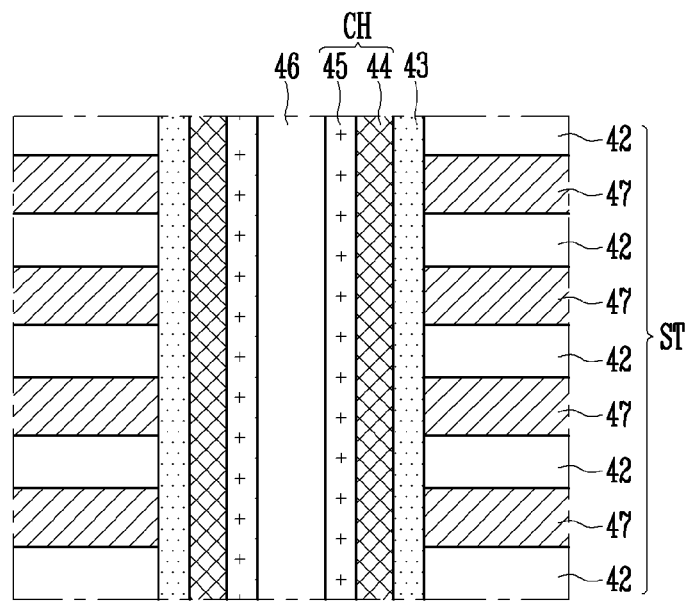

FIGS. 4A to 4C are diagrams illustrating a method of manufacturing a semiconductor device according to an embodiment of the present disclosure.

Referring to FIG. 4A, the stack structure ST may be formed. The stack structure ST may include first material layers 41 and second material layers 42 alternately stacked with each other. The first material layers 41 may be provided to form gate electrodes of a memory cell, select transistors, or the like. The second material layers 42 may be provided to insulate the stacked gate electrodes from each other.

The first material layers 41 may include a material having high etch selectivity with respect to the second material layers 42. For example, the first material layers 41 may be sacrificial layers including a nitride, or the like, and the second material layers 42 may be insulating layers including an oxide, or the like. Alternatively, the first material layers 41 may be conductive layers including polysilicon, tungsten, or the like, and the second material layers 42 may be insulating layers including an oxide, or the like. In another example, the first material layers 41 may be conductive layers including doped polysilicon, or the like, and the second material layers 42 may be sacrificial layers including undoped polysilicon, or the like.

Referring to FIG. 4B, an opening OP passing through the stack structure ST may be formed. Although FIG. 4B illustrates a single opening OP, a plurality of openings OP passing through the stack structure ST may be formed. Each opening OP may have a shape such as a circle, an ellipse, a polygon, or the like in a plan view. In addition, the plurality of openings OP may be arranged in a first direction and a second direction crossing the first direction, and may be arranged in a matrix format. Alternatively, the centers of the plurality of openings OP may be arranged to be misaligned each other.

Referring to FIG. 4C, the channel structure CH may be formed in the opening OP. For example, after a first channel layer 44 is formed in the opening OP, a second channel layer 45 may be formed in the first channel layer 44. The memory layer 43 may be formed before the first channel layer 44 is formed.

The first channel layer 44 and the second channel layer 45 may be formed using a deposition process. For example, the first channel layer 44 and the second channel layer 45 may be formed using a Chemical Vapor Deposition (CVD) method or an Atomic Layer Deposition (ALD) method.

The first channel layer 44 may include a material having a higher oxygen content than the second channel layer 45. Oxygen contents of the first and second channel layers 44 and 45 may be adjusted by increasing or decreasing a flow of oxygen gas used for a deposition process. For example, a flow of oxygen gas used for depositing the first channel layer 44 may be greater than a flow of oxygen gas used for depositing the second channel layer 45.

A thickness of the second channel layer 45 may be less than a thickness of the first channel layer 44. Thicknesses of the first and second channel layers 44 and 45 may be adjusted by increasing or decreasing a time for a deposition process. For example, a time for depositing the second channel layer 45 may be shorter than a time for depositing the first channel layer 44.

The first channel layer 44 and the second channel layer 45 may have different metal compositions from each other. Metal compositions of the first and second channel layers 44 and 45 may be adjusted by increasing or decreasing a flow of metal precursor gas used for a deposition process.

In an embodiment, a flow of indium precursor gas used for forming the first channel layer 44 may be greater than a flow of indium precursor gas used for forming the second channel layer 45, so that a concentration of indium (In) of the first channel layer 44 is higher than a concentration of indium (In) of the second channel layer 45.

In another embodiment, a flow of tin precursor gas used for forming the first channel layer 44 may be greater than a flow of tin precursor gas used for forming the second channel layer 45, so that a concentration of tin (Sn) of the first channel layer 44 is higher than a concentration of tin (Sn) of the second channel layer 45.

In another embodiment, a flow of gallium precursor gas used for forming the first channel layer 44 may be smaller than a flow of gallium precursor gas used for forming the second channel layer 45, so that a concentration of gallium (Ga) of the first channel layer 44 is lower than a concentration of gallium (Ga) of the second channel layer 45.

According to an embodiment, the first and second channel layers 44 and 45 may include Indium Tin Zinc Oxide (ITZO). A flow of indium precursor gas used for forming the first channel layer 44 may be greater than a flow of indium precursor gas used for forming the second channel layer 45. Alternatively, a flow of tin precursor gas used for forming the first channel layer 44 may be greater than a flow of tin precursor gas used for forming the second channel layer 45. Accordingly, a channel structure CH including the first channel layer 44 with a relatively high carrier mobility and the second channel layer 45 with a relatively low carrier mobility may be formed.

Subsequently, a gap-fill insulating layer 46 may be formed in an opening of a tubular-shaped second channel layer 45. When the second channel layer 45 completely fills the opening OP, a process for forming the gap-fill insulating layer 46 may be omitted.

Subsequently, an additional process may be performed depending on materials of the first material layers 41 and the second material layers 42. The first material layers 41 or the second material layers 42 may be replaced by third material layers 47 after a slit (not illustrated) passing through the stack structure ST is formed. For example, when the first material layers 41 are sacrificial layers and the second material layers 42 are insulating layers, the first material layers 41 may be replaced by conductive layers. Alternatively, conductive layers may be formed after a memory layer is additionally formed in a region from which the first material layers 41 are removed. In another example, when the first material layers 41 are conductive layers and the second material layers 42 are insulating layers, the first material layers 41 may be silicidized. In another example, when the first material layers 41 are sacrificial layers and the second material layers 42 are conductive layers, the second material layers 42 may be replaced by insulating layers.

According to the manufacturing method described above, the first channel layer 44 and the second channel layer having different characteristics from each other may be formed.

Figure 5A:
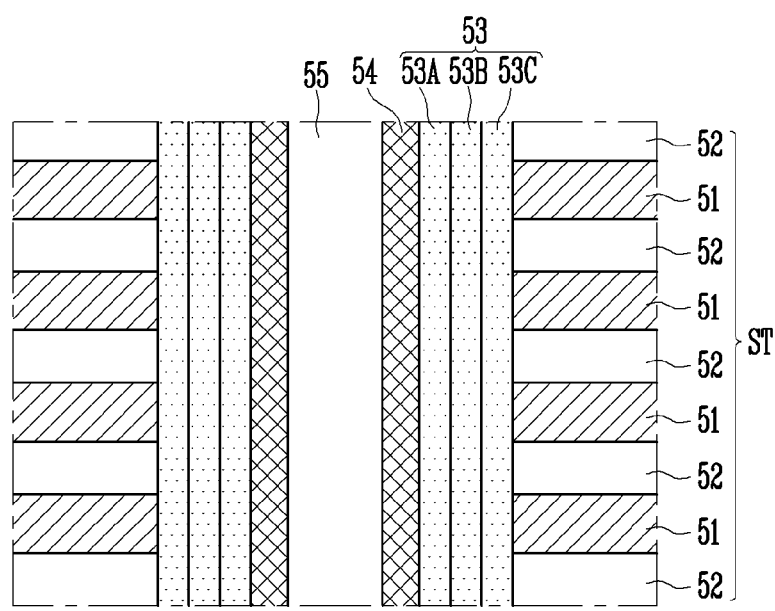
FIGS. 5A to 5C are diagrams illustrating a structure and characteristics of a semiconductor device according to an embodiment of the present disclosure.
Figure 5B:
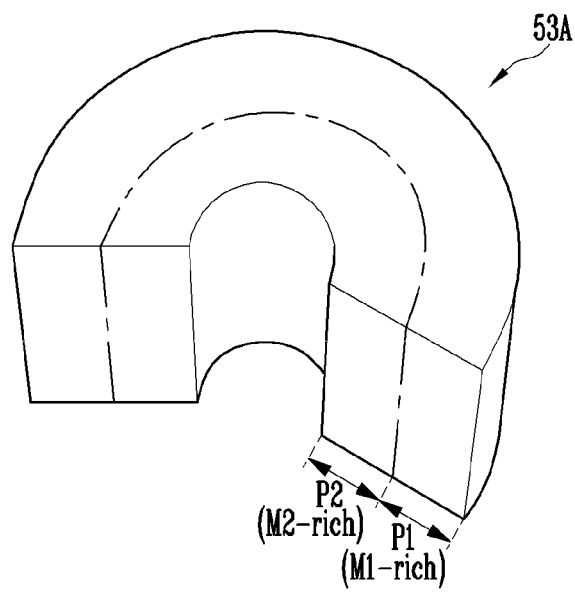
Figure 5C:
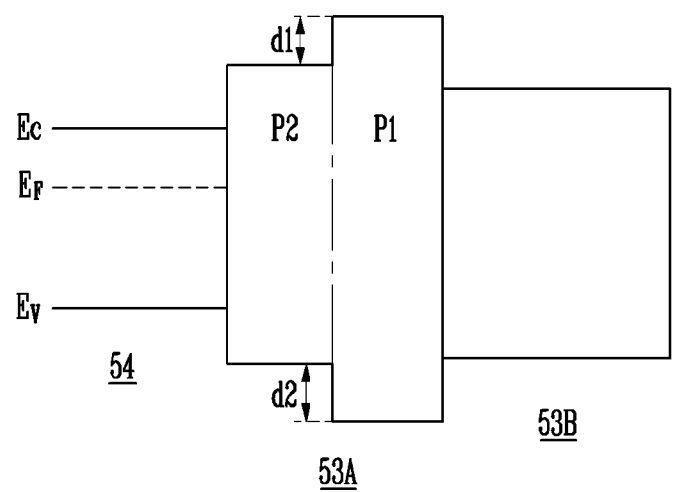

FIGS. 5A to 5C are diagrams illustrating a structure and characteristics of a semiconductor device according to an embodiment of the present disclosure. FIG. 5A is a cross-sectional diagram of the semiconductor device. FIG. 5B is a perspective view of a tunnel insulating layer. FIG. 5C is an energy band diagram of the tunnel insulating layer.

Referring to FIG. 5A, a semiconductor device according to an embodiment of the present disclosure may include a stack structure ST, a memory layer 53, and a channel layer 54. In addition, the semiconductor device may further include a gap-fill insulating layer 55.

The stack structure ST may include conductive layers 51 and insulating layers 52 alternately stacked with each other. The conductive layers 51 may be gate electrodes of a select transistor, a memory cell, or the like, and may include polysilicon, tungsten, metal, or the like. The insulating layers 52 may be provided to insulate the stacked gate electrodes from each other and may include an insulating material such as an oxide or a nitride.

The channel layer 54 and the memory layer 53 may pass through the stack structure ST in a stacking direction. The stacking direction may be a direction in which the conductive layers 51 and the insulating layers 52 are stacked, and a direction perpendicular to a surface of the substrate.

The channel layer 54 may be a region in which a channel such as a select transistor or a memory cell is formed. A select transistor or a memory cell may be located in intersections of the channel layer 54 and the conductive layers 51. The channel layer 54 may include a semiconductor material such as silicon (Si) or germanium (Ge). Alternatively, the channel layer 54 may correspond to the channel structure CH as described above with reference to FIGS. 1A to 4C. The channel layer 54 may include a multilayer film and a metal oxide-based semiconductor such as Indium Zinc Oxide (IZO), Zinc Tin Oxide (ZTO), Indium Gallium Zinc Oxide (IGZO), or Indium Tin Zinc Oxide (ITZO).

The memory layer 53 may include at least one of a tunnel insulating layer 53A, a data storage layer 53B, and a charge blocking layer 53C. The memory layer 53 may be formed such that the tunnel insulating layer 53A surrounds the channel layer 54, the data storage layer 53B surrounds the tunnel insulating layer 53A, and the charge blocking layer 53C surrounds the data storage layer 53B. The data storage layer 53B may include a floating gate, a charge trapping material, silicon, a nitride, nanodots, a variable resistance material, a phase change material, and the like.

Referring to FIGS. 5A to 5C, the tunnel insulating layer 53A may be interposed between the channel layer 54 and the data storage layer 53B. The tunnel insulating layer 53A may be a single layer including an outer side portion P1 and an inner side portion P2. The outer side portion P1 may be located adjacent to the data storage layer 53B and the inner side portion P2 may be located adjacent to the channel layer 54.

The tunnel insulating layer 53A may include a metal oxide and the metal oxide may include first metal M1 and second metal M2. The outer side portion P1 and the inner side portion P2 may have different metal compositions from each other. The outer side portion P1 may have a higher concentration of the first metal than the inner side portion P2 (M1-rich) and the inner side portion P2 may have a higher concentration of the second metal than the outer side portion P1 (M2-rich). The outer side portion P1 may include both of the first metal M1 and the second metal M2. The outer side portion P1 may have a higher concentration of the first metal M1 and a lower concentration of the second metal M2 than the inner side portion P2. For example, the outer side portion P1 may comprise greater than or equal to 70% by volume of the first metal M1. The inner side portion P2 may include both of the first metal M1 and the second metal M2. The inner side portion P2 may have a higher concentration of the second metal M2 and a lower concentration of the first metal M1 than the outer side portion P1. For example, an amount of the second metal M2 in the inner side portion P2 may be greater than or equal to 70%.

Referring to Table 2, a material of the tunnel insulating layer 53A may be determined considering adhesion between the tunnel insulating layer 53A and the channel layer 54, magnetic dipole moments, dielectric constants, and the like of the first metal M1 and the second metal M2.

TABLE 2

| Type | Adhesion | Energy level | Difference in magnetic dipole moment (J/T) | Dielectric constant |
|------|----------|--------------|--------------------------------------------|---------------------|
| ZrAlO | ○ | ⊚ | 5.452 | 13~17 |
| GaZrO | ○ | Δ | 3.872 | 16~25 |
| AlSiO | ⊚ | Δ | 4.197 | 4~10 |

A material having excellent adhesion with respect to the channel layer 54 may be selected as a material of the tunnel insulating layer 53A. In addition, a material having a high dielectric constant (high-k) may be selected as a material of the tunnel insulating layer 53A.

Materials for the tunnel insulating layer 53A may be selected to have a difference d1 in the highest energy level $E_C$ of the conduction band of the first metal M1 and the second metal M2 of 1.0 eV or more. In addition, the materials may have a difference d2 in the lowest energy level $E_V$ of the valence band of the first metal M1 and the second metal M2 of 1.0 eV or more. As seen in FIG. 5C, the materials of the tunnel insulating layer 53A may be configured to have differences d1 and d2 in energy levels.

A material having great difference in magnetic dipole moment between the first metal M1 and the second metal M2 may be used in the tunnel insulating layer 53A. The first metal M1 and the second metal M2 may have different magnetic characteristics from each other. In particular, second metal M2 may be a stronger magnet than the first metal M1. For example, the second metal M2 is ferromagnetic metal and the first metal M1 may be diamagnetic metal or paramagnetic metal.

Considering the features described above, the tunnel insulating layer 53A may include ZrAlO, GaZrO, AlSiO, or a combination thereof. When the tunnel insulating layer 53A is ZrAlO, the first metal M1 may be aluminum (Al) and the second metal M2 may be zirconium (Zr). When the tunnel insulating layer 53A is GaZrO, the first metal M1 may be zirconium (Zr) and the second metal M2 may be gallium (Ga). When the tunnel insulating layer 53A is AlSiO, the first metal M1 may be silicon (Si) and the second metal M2 may be aluminum (Al).

According to the structure described above, the tunnel insulating layer 53A may have a single-layered structure including the outer side portion P1 and the inner side portion P2 and the outer side portion P1 may have a different metal composition from the inner side portion P2. Accordingly, the tunnel insulting layer 53A may have different bandgaps for different regions of the layer, thereby reducing leakage current and improving operating speed. In addition, because an interface is not present in the tunnel insulating layer 53A, embodiments of the present disclosure may prevent trapping a charge in a trap site of an interface.

Figure 6A:
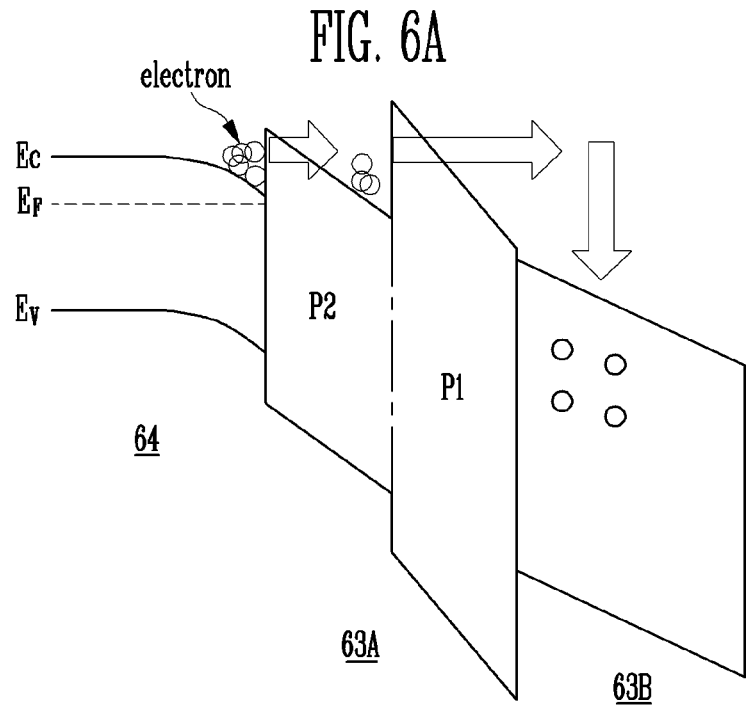
FIGS. 6A and 6B are energy band diagrams of a tunnel insulating layer according to an embodiment of the present disclosure.
Figure 6B:
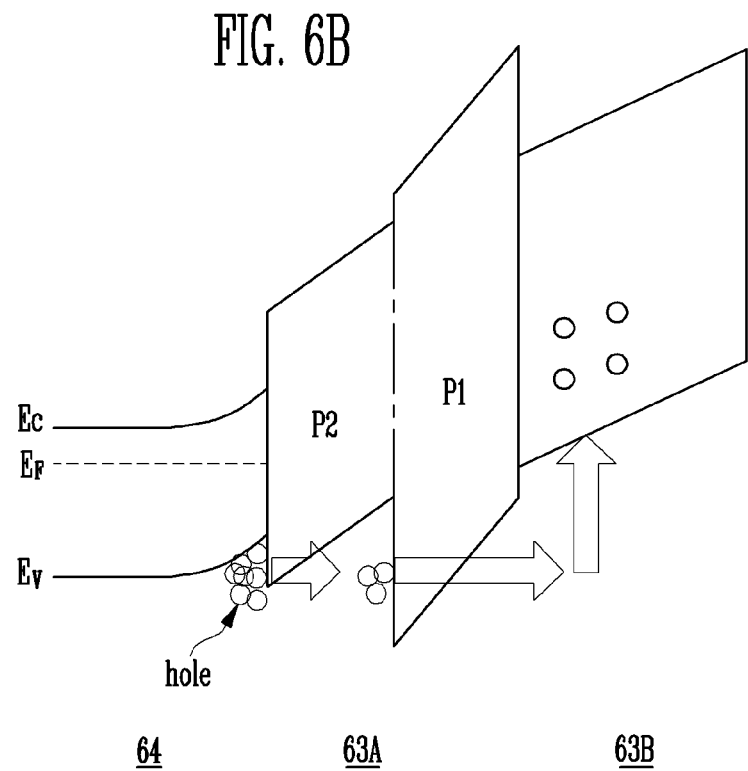

FIGS. 6A and 6B are energy band diagrams of a tunnel insulating layer according to an embodiment of the present disclosure. FIG. 6A is an energy band diagram of a program operation. FIG. 6B is an energy band diagram of an erase operation.

In FIGS. 6A and 6B, a tunnel insulating layer 63A may be interposed between a channel layer 64 and a data storage layer 63B and may include the outer side portion P1 and the inner side portion P2. The outer side portion P1 may be a region which is rich in first metal and the inner side portion P2 may be a region which is rich in second metal.

Referring to FIG. 6A, electrons may be injected into the data storage layer 63B from the channel layer 64 via the tunnel insulating layer 63A by Fowler-Nordheim tunneling (F-N tunneling) during a program operation. An effective tunneling distance may be reduced due to a difference in properties between the outer side portion P1 and the inner side portion P2. Accordingly, a speed of a program operation may be improved.

Referring to FIG. 6B, holes may be injected into the data storage layer 63B from the channel layer 64 via the tunnel insulating layer 63A during an erase operation. Because an interface is not present between the outer side portion P1 and the inner side portion P2 of the tunnel insulating layer 63A, trapping holes in an interface may be prevented when holes are injected. Accordingly, a speed of an erase operation may be improved.

Figure 7A:
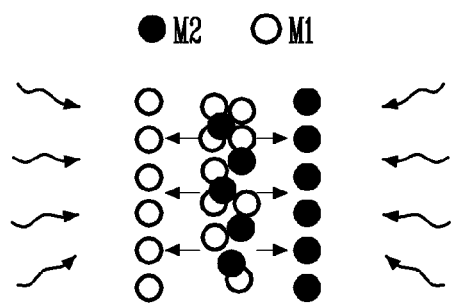
FIGS. 7A to 7C are mimetic diagrams illustrating a method of forming a tunnel insulating layer according to an embodiment of the present disclosure.
Figure 7B:
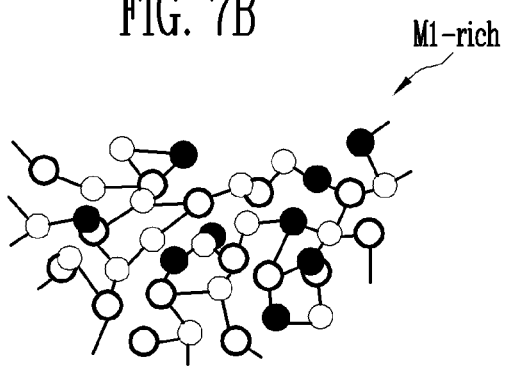
Figure 7C:
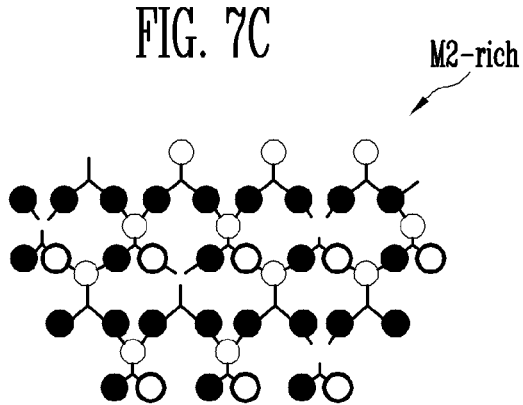

FIGS. 7A to 7C are mimetic diagrams illustrating a method of forming a tunnel insulating layer according to an embodiment of the present disclosure.

Referring to FIG. 7A, a heat treatment process may be performed for band-gap engineering of a tunnel insulating layer. When the heat treatment process is performed, a difference in dopant solubility between the first metal M1 and the second metal M2 may occur, and the first metal M1 may be segregated from the second metal M2 may to form a stable state. Accordingly, a single layer of the tunnel insulating layer may be segregated into a first region which is rich in the first metal M1 and a second region which is rich in the second metal M2 concurrently within the tunnel insulating layer.

FIG. 7B illustrates the region which is rich in the first metal M1. Referring to FIG. 7B, a concentration of the first metal M1 is higher than a concentration of the second metal M2. FIG. 7C illustrates the region which is rich in the second metal M2. Referring to FIG. 7C, a concentration of the second metal M2 is higher than a concentration of the first metal M1.

Figure 8A:
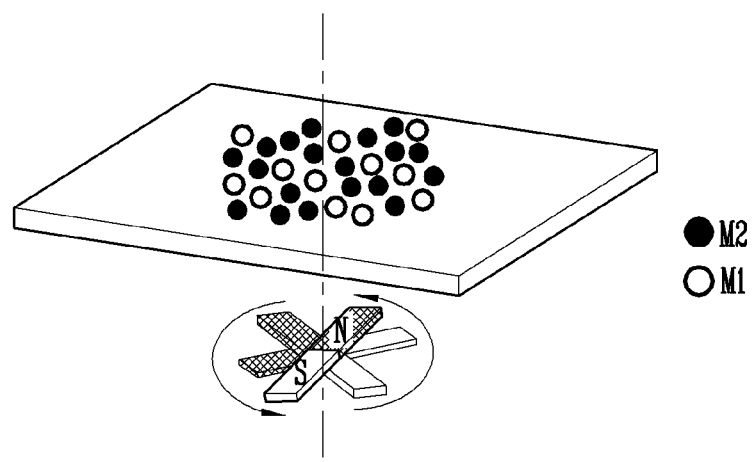
FIGS. 8A and 8B are mimetic diagrams illustrating a method of forming a tunnel insulating layer according to an embodiment of the present disclosure.
Figure 8B:
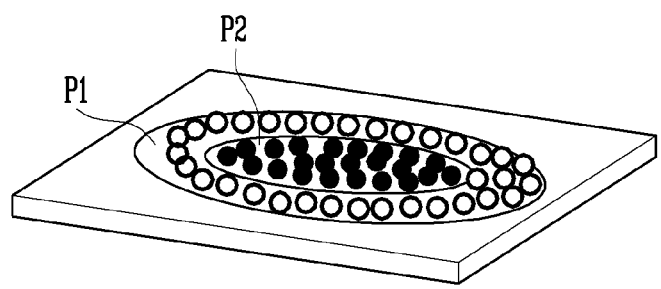

FIGS. 8A and 8B are mimetic diagrams illustrating a method of forming a tunnel insulating layer according to an embodiment of the present disclosure.

Referring to FIG. 8A, a magnetic field treatment process may be performed for band-gap engineering of a tunnel insulating layer. The first metal M1 and the second metal M2 included in the tunnel insulating layer may be segregated by the magnetic field treatment process. The magnetic field treatment process may be performed by using a chamber including a magnet for generating a magnetic field.

When the magnetic field treatment process is performed, a weak magnetic field is generated in an inner side of the tunnel insulating layer around an axis and a ferromagnetic field is generated in an outer side. Accordingly, ferromagnetic metal to which strong magnetic attraction with respect to a magnet is applied may move inward, that is, toward the inner side. Paramagnetic metal to which weak magnetic attraction with respect to the magnet is applied or diamagnetic metal to which magnetic repulsion with respect to the magnet is applied may move outward, that is, toward the outer side.

When the tunnel insulating layer includes the diamagnetic first metal M1 or the paramagnetic first metal M1 and the ferromagnetic second metal M2, the second metal M2 may move inward and the first metal M1 may move outward.

Referring to FIG. 8B, the first metal M1 and the second metal M2 may be segregated from each other in the tunnel insulating layer by magnetism applied to the tunnel insulating layer. Accordingly, the outer side portion P1 which is rich in the first metal M1 and the inner side portion P2 which is rich in the second metal M2 may be present in the tunnel insulating layer.

Figure 9A:
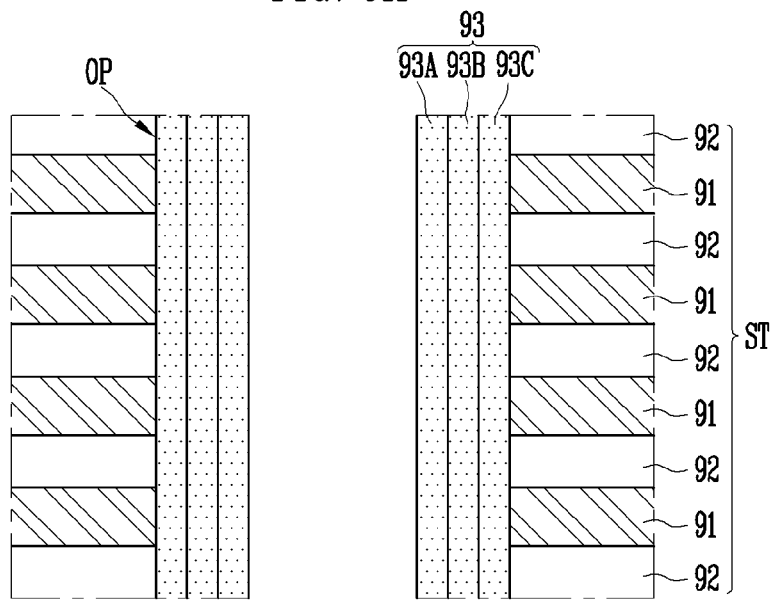
FIGS. 9A to 9C are diagrams illustrating a method of manufacturing a semiconductor device according to an embodiment of the present disclosure.
Figure 9B:
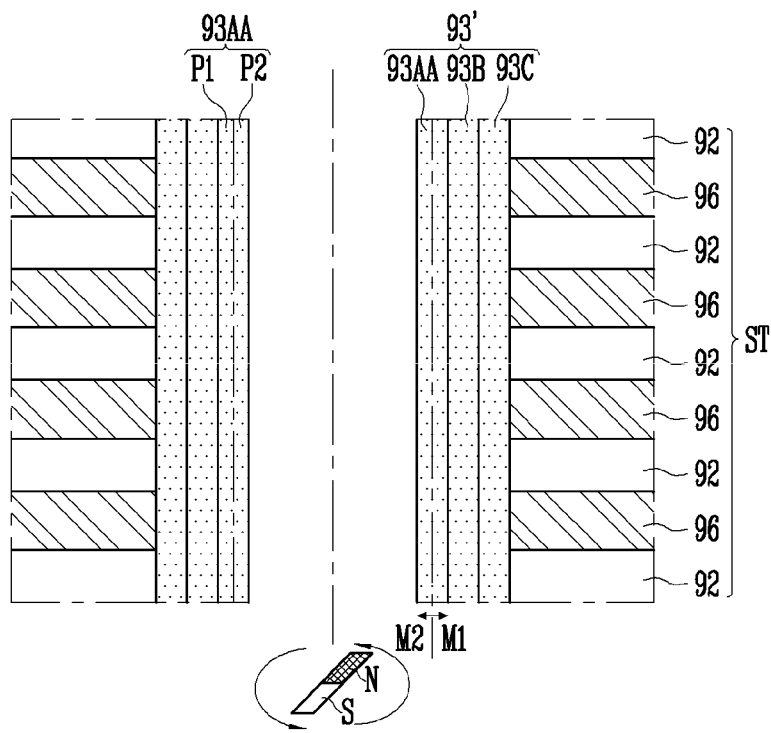
Figure 9C:
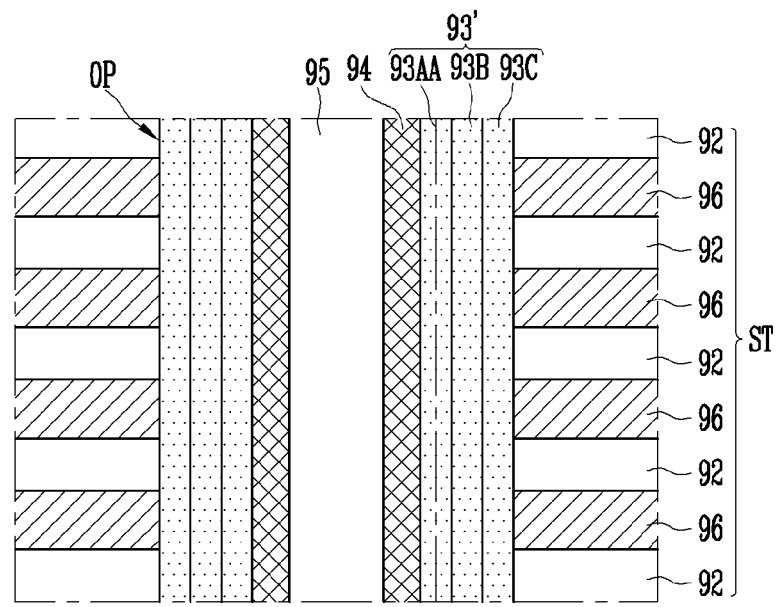

FIGS. 9A to 9C are diagrams illustrating a method of manufacturing a semiconductor device according to an embodiment of the present disclosure.

Referring to FIG. 9A, the stack structure ST may be formed. The stack structure ST may include first material layers 91 and second material layers 92 alternately stacked with each other. The first material layers 91 may be provided to form gate electrodes of a memory cell, a select transistor, or the like. The second material layers 92 may be provided to insulate the stacked gate electrodes from each other.

The first material layers 91 may include a material having high etch selectivity with respect to the second material layers 92. For example, the first material layers 91 may be sacrificial layers including a nitride, or the like, and the second material layers 92 may be insulating layers including an oxide, or the like. Alternatively, the first material layers 91 may be conductive layers including polysilicon, tungsten, or the like, and the second material layers 92 may be insulating layers including an oxide, or the like. In another example, the first material layers 91 may be conductive layers including doped polysilicon, or the like, and the second material layers 92 may be sacrificial layers including undoped polysilicon, or the like.

Subsequently, the opening OP passing through the stack structure ST may be formed. Although FIG. 9A illustrates a single opening OP, a plurality of openings OP passing through the stack structure ST may be formed. Each opening OP may have a shape such as a circle, an ellipse, a polygon, or the like in a plan view. In addition, the plurality of openings OP may be arranged in a matrix format or the centers of the plurality of openings OP may be arranged to be misaligned each other.

Subsequently, a memory layer 93 may be formed in the opening OP. For example, a charge blocking layer 93C, a data storage layer 93B, and a tunnel insulating layer 93A may be sequentially formed. The tunnel insulating layer 93A may include a metal oxide and the metal oxide may include first metal and second metal.

Referring to FIG. 9B, band-gap engineering may be performed. A metal composition in a tunnel insulating layer 93AA included in a memory layer 93' may be adjusted by the band-gap engineering. The first metal M1 and the second metal M2 may be segregated in the tunnel insulating layer 93AA by the band-gap engineering. Accordingly, the tunnel insulating layer 93AA may include the outer side portion P1 which is rich in the first metal M1 and the inner side portion P2 which is rich in the second metal M2. The band-gap engineering may be performed by using the heat treatment process as described with reference to FIGS. 7A and 7B, by the magnetic field treatment process as described with reference to FIGS. 8A and 8B, or by a combination of those processes.

Referring to FIG. 9C, a gap-fill insulating layer 95 may be formed in a channel layer 94 after the channel layer 94 is formed in the memory layer 93'. When the channel layer 94 completely fills the opening OP, no gap-fill insulating layer 95 is formed.

Subsequently, an additional process may be performed depending on materials of the first material layers 91 and the second material layers 92. The first material layers 91 or the second material layers 92 may be replaced by third material layers 96. For example, when the first material layers 91 are sacrificial layers and the second material layers 92 are insulating layers, the first material layers 91 may be replaced by conductive layers. Alternatively, conductive layers may be formed after a memory layer is additionally formed in a region from which the first material layers 91 are removed. In another example, when the first material layers 91 are conductive layers and the second material layers 92 are insulating layers, the first material layers 91 may be silicidized. In another example, when the first material layers 91 are conductive layers and the second material layers 92 are sacrificial layers, the second material layers 92 may be replaced by insulating layers.

In different embodiments, band-gap engineering may be performed before or after the channel layer 94 or the gap-fill insulating layer 95 is formed.

According to the manufacturing method described above, the tunnel insulating layer 93AA in which the outer side portion P1 and the inner side portion P2 have different bandgaps may be formed by the band-gap engineering. Forming a single-layered tunnel insulating layer 93AA may simplify a manufacturing and reduce costs compared to forming a tunnel insulating layer by depositing multiple discrete material layers.

Figure 10:
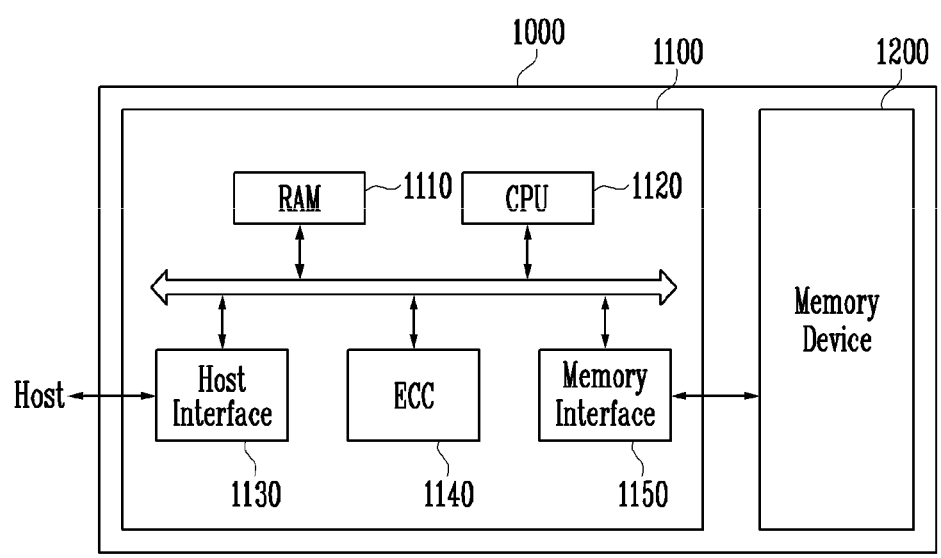
FIG. 10 is a block diagram illustrating the configuration of a memory system according to an embodiment of the present disclosure.

FIG. 10 is a block diagram illustrating the configuration of a memory system 1000 according to an embodiment of the present disclosure.

Referring to FIG. 10, the memory system 1000 according to an embodiment of the present disclosure may include a memory device 1200 and a controller 1100.

The memory device 1200 may be used to store data information having various data formats such as a text format, a graphical format, and a software code format. The memory device 1200 may be a non-volatile memory device. Furthermore, the memory device 1200 may have the structure described above with reference to FIGS. 1A to 9C, and may be manufactured by the manufacturing method described above with reference to FIGS. 1A to 9C. According to an embodiment, the memory device 1200 may be configured to include a stack structure including conductive layers and insulating layers alternately stacked with each other, a first channel layer passing through the stack structure and including a metal oxide-based semiconductor, and a second channel layer formed in the first channel layer and including the metal oxide-based semiconductor, in which the first channel layer has a higher oxygen content than the second channel layer and has a different thickness from the second channel layer. According to an embodiment, the memory device 1200 may be configured to include a stack structure including conductive layers and insulating layers alternately stacked with each other, a channel layer passing through the stack structure, a tunnel insulating layer interposed between the channel layer and the stack structure and including a metal oxide which includes first metal and second metal with different magnetic strengths, and a data storage layer interposed between the tunnel insulating layer and the stack structure, in which the tunnel insulating layer is a single layer which includes an inner side portion adjacent to the channel layer and an outer side portion adjacent to the data storage layer, the outer side portion is rich in the first metal M1, and the inner side portion is rich in the second metal M2. Because the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include Random Access Memory (RAM) 1110, a Central Processing Unit (CPU) 1120, a host interface 1130, an Error Correction Code (ECC) circuit 1140, a memory interface 1150, and the like.

The RAM 1110 may be used as an operation memory of the CPU 1120, a cache memory between the memory device 1200 and the host, a buffer memory between the memory device 1200 and the host, or the like. The RAM 1110 may be replaced with Static Random Access Memory (SRAM), Read Only Memory (ROM), or the like.

The CPU 1120 may control the overall operations of the controller 1100. For example, the CPU 1120 may operate firmware, such as a Flash Translation Layer (FTL), stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

The controller 1100 may further include a buffer memory (not illustrated) for temporarily storing data. The buffer memory may be used to temporarily store data to be transferred to an external device through the host interface 1130 or data to be transferred from the memory device 1200 through the memory interface 1150. The controller 1100 may further include ROM which stores code data to interface with the host.

Because the memory system 1000 according to the embodiment includes the memory device 1200 having improved integration density and characteristics, the memory system 1000 may also have improved integration density and characteristics accordingly.

Figure 11:
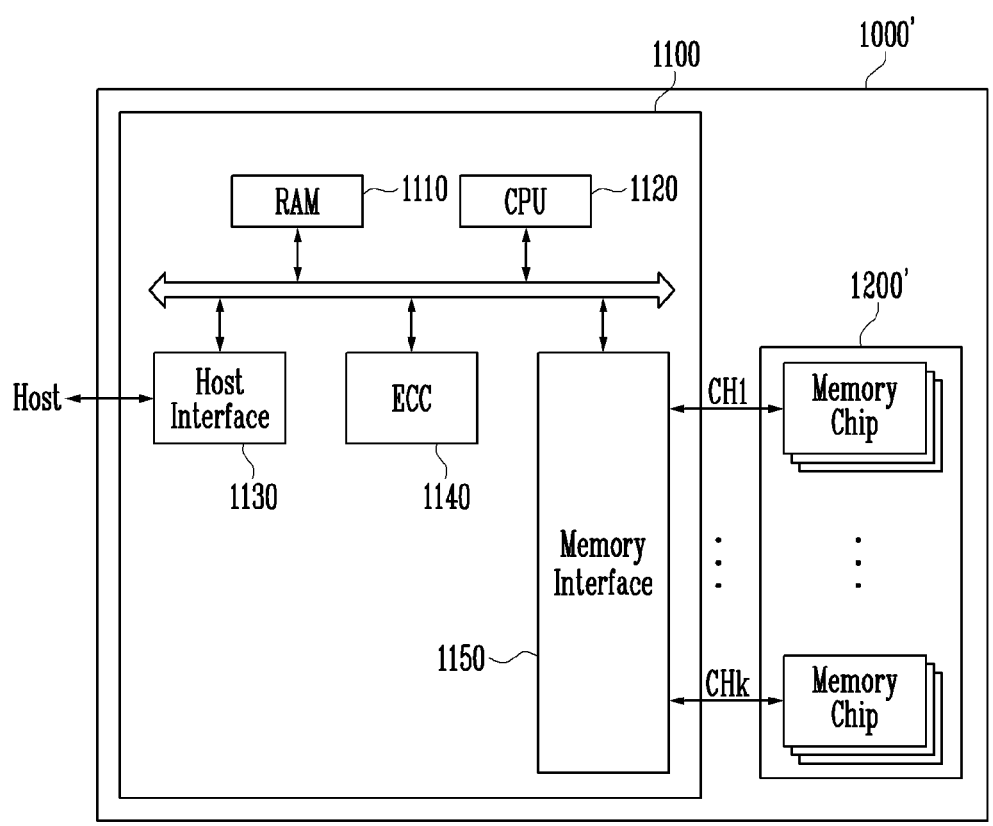
FIG. 11 is a block diagram illustrating the configuration of a memory system according to an embodiment of the present disclosure.

FIG. 11 is a block diagram illustrating the configuration of a memory system 1000' according to an embodiment of the present disclosure. Hereinafter, any repetitive detailed description of components already mentioned above will be omitted.

Referring to FIG. 11, the memory system 1000' according to an embodiment may include a memory device 1200' and the controller 1100. The controller 1100 may include the RAM 1110, the CPU 1120, the host interface 1130, the ECC circuit 1140, and the memory interface 1150, and the like.

The memory device 1200' may be a non-volatile memory device. Furthermore, the memory device 1200' may have the structure as described above with reference to FIGS. 1A to 9C, and may be manufactured by the manufacturing method described above with reference to FIGS. 1A to 9C. According to an embodiment, the memory device 1200' may be configured to include a stack structure including conductive layers and insulating layers alternately stacked with each other, a first channel layer passing through the stack structure and including a metal oxide-based semiconductor, and a second channel layer formed in the first channel layer and including the metal oxide-based semiconductor, in which the first channel layer has a higher oxygen content than the second channel layer and has a different thickness from the second channel layer. According to an embodiment, the memory device 1200' may be configured to include a stack structure including conductive layers and insulating layers alternately stacked with each other, a channel layer passing through the stack structure, a tunnel insulating layer interposed between the channel layer and the stack structure and including a metal oxide which includes first metal and second metal having different magnetism from each other, and a data storage layer interposed between the tunnel insulating layer and the stack structure, in which the tunnel insulating layer is a single layer which includes an inner side portion adjacent to the channel layer and an outer side portion adjacent to the data storage layer, the outer side portion is rich in the first metal M1, and the inner side portion is rich in the second metal M2. Because the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups which may communicate with the controller 1100 through first to kth channels CH1 to CHk, respectively. In addition, memory chips, included in a single group, may be configured to communicate with the controller 1100 through a common channel. The memory system 1000' may be modified so that a single memory chip may be coupled to a single channel.

Because the memory system 1000' according to the embodiment includes the memory device 1200' having improved integration density and characteristics, the integration density and characteristics of the memory system 1000' may also be improved. In addition, because the memory device 1200' is formed into a multi-chip package, data storage capacity and a driving speed of the memory system 1000' may be further increased.

Figure 12:
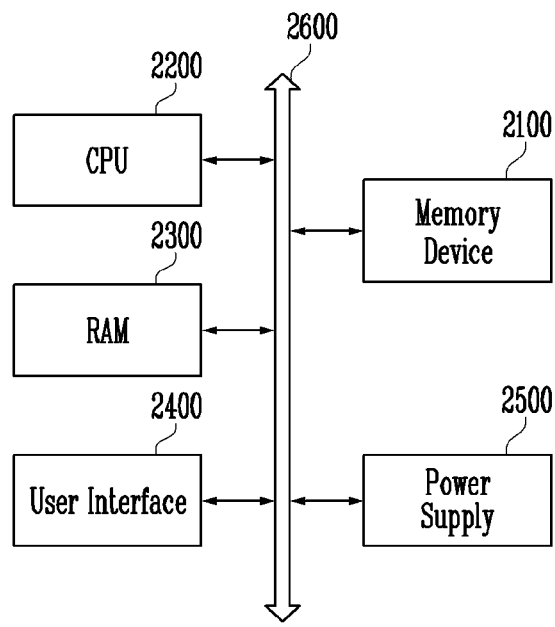
FIG. 12 is a block diagram illustrating the configuration of a computing system according to an embodiment of the present disclosure.

FIG. 12 is a block diagram illustrating the configuration of a computing system 2000 according to an embodiment of the present disclosure. Hereinafter, any repetitive detailed description of components already mentioned above will be omitted.

Referring to FIG. 12, the computing system 2000 according to an embodiment of the present disclosure may include a memory device 2100, a CPU 2200, RAM 2300, a user interface 2400, a power supply 2500, a system bus 2600, and the like.

The memory device 2100 may store data provided via the user interface 2400, data processed by the CPU 2200, and the like. The memory device 2100 may be electrically coupled to the CPU 2200, the RAM 2300, the user interface 2400, and the power supply 2500 through the system bus 2600. For example, the memory device 2100 may be coupled to the system bus 2600 via a controller (not illustrated), alternatively, directly coupled to the system bus 2600. When the memory device 2100 is directly coupled to the system bus 2600, functions of the controller may be performed by the CPU 2200, the RAM 2300, or the like.

The memory device 2100 may be a non-volatile memory device. Furthermore, the memory device 2100 may have the structure described above with reference to FIGS. 1A to 9C, and may be manufactured by the manufacturing method described above with reference to FIGS. 1A to 9C. According to an embodiment, the memory device 2100 may be configured to include a stack structure including conductive layers and insulating layers alternately stacked with each other, a first channel layer passing through the stack structure and including a metal oxide-based semiconductor, and a second channel layer formed in the first channel layer and including the metal oxide-based semiconductor, in which the first channel layer has a higher oxygen content than the second channel layer and has a different thickness from the second channel layer. According to an embodiment, the memory device 2100 may be configured to include a stack structure including conductive layers and insulating layers alternately stacked with each other, a channel layer passing through the stack structure, a tunnel insulating layer interposed between the channel layer and the stack structure and including a metal oxide which includes first metal and second metal with different magnetic strengths, and a data storage layer interposed between the tunnel insulating layer and the stack structure, in which the tunnel insulating layer is a single layer which includes an inner side portion adjacent to the channel layer and an outer side portion adjacent to the data storage layer, the outer side portion is rich in the first metal M1, and the inner side portion is rich in the second metal M2. Since the memory device 2100 is configured and manufactured in the same manner as described above, a detailed description thereof will be omitted.

As described above with reference to FIG. 11, the memory device 2100 may be a multi-chip package including a plurality of memory chips.

The computing system 2000 having the above-described configuration may be a computer, an Ultra Mobile PC (UMPC), a workstation, a net-book, a Personal Digital Assistant (PDA), a portable computer, a web tablet, a wireless phone, a mobile phone, a smartphone, an e-book, a Portable Multimedia Player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices forming a home network, one of various electronic devices forming a computer network, one of various electronic devices forming a telematics network, an RFID device, or the like.

As described above, because the computing system 2000 according to the embodiment includes the memory device 2100 having improved integration density and characteristics, the characteristics of the computing system 2000 may also be improved.

Figure 13:
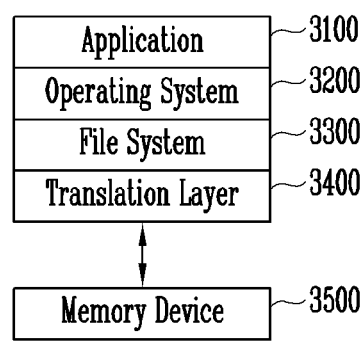
FIG. 13 is a block diagram illustrating the configuration of a computing system according to an embodiment of the present disclosure.

FIG. 13 is a block diagram illustrating a computing system 3000 according to an embodiment of the present disclosure.

Referring to FIG. 13, the computing system 3000 according to an embodiment may include a software layer that has an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may be various application programs executed in the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux-based system, the file system 3300 may be an extended file system (EXT), a Unix File System (UFS), a Journaling File System (JFS), or the like.

FIG. 13 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a Flash Translation Layer (FTL), a Universal Flash Storage Link Layer (ULL), or the like.

The memory device 3500 may be a non-volatile memory device. Furthermore, the memory device 3500 may have the structure described above with reference to FIGS. 1A to 9C, and may be manufactured by the manufacturing method described above with reference to FIGS. 1A to 9C. According to an embodiment, the memory device 3500 may be configured to include a stack structure including conductive layers and insulating layers alternately stacked with each other, a first channel layer passing through the stack structure and including a metal oxide-based semiconductor, and a second channel layer formed in the first channel layer and including the metal oxide-based semiconductor, in which the first channel layer has a higher oxygen content than the second channel layer and has a different thickness from the second channel layer. According to an embodiment, the memory device 3500 may be configured to include a stack structure including conductive layers and insulating layers alternately stacked with each other, a channel layer passing through the stack structure, a tunnel insulating layer interposed between the channel layer and the stack structure and including a metal oxide which includes first metal and second metal with different magnetic strengths, and a data storage layer interposed between the tunnel insulating layer and the stack structure, in which the tunnel insulating layer is a single layer which includes an inner side portion adjacent to the channel layer and an outer side portion adjacent to the data storage layer, the outer side portion is rich in the first metal M1, and the inner side portion is rich in the second metal M2. Because the memory device 3500 is configured and manufactured in the same manner as described above, a detailed description thereof will be omitted.

The computing system 3000 having the above-described configuration may be divided into an operating system layer that is operated in an upper level region and a controller layer that is operated in a lower level region. The application 3100, the operating system 3200, and the file system 3300 may be included in the operating system layer, and may be driven by an operating memory of the computing system 3000. In addition, the translation layer 3400 may be included in the operating system layer or the controller layer.

As described above, because the computing system 3000 according to the embodiment includes the memory device 3500 having improved integration density and characteristics, the characteristics of the computing system 3000 may also be improved.

In accordance with various embodiments of the disclosure, a semiconductor device having a stabilized structure and improved reliability may be provided. In addition, a method of manufacturing a semiconductor device may be simplified with a lower level of difficulty of processes and lower manufacturing costs.

Embodiments have been disclosed herein, and although specific terms are employed, they are used and are to be interpreted in a generic and descriptive sense only and not for the purpose of limitation. Accordingly, it will be understood by a person of ordinary skill in the art to which the disclosure pertains that various changes in forms and details may be made without departing from the spirit and scope of the present disclosure as set forth in the following claims.

What is claimed is:
1. A semiconductor device, comprising:
a stack structure including conductive layers and insulating layers that are alternately stacked with each other;
a first channel layer passing through the stack structure and including a metal oxide-based semiconductor; and
a second channel layer adjacent to the first channel layer and including the metal oxide-based semiconductor,
wherein the first channel layer has a higher oxygen content than the second channel layer and has a different thickness from the second channel layer.
2. The semiconductor device of claim 1, wherein the second channel layer has a thickness less than or equal to 5 nm.
3. The semiconductor device of claim 1, wherein a thickness of the second channel layer is less than a thickness of the first channel layer.

4. The semiconductor device of claim 1, wherein the first channel layer has a metal composition that is different from a metal composition of the second channel layer.

5. The semiconductor device of claim 1, wherein the first channel layer and the second channel layer include Indium Tin Zinc Oxide (ITZO).

6. The semiconductor device of claim 5, wherein the first channel layer has a higher concentration of indium than the second channel layer.

7. The semiconductor device of claim 5, wherein the first channel layer has a higher concentration of tin than the second channel layer.

8. The semiconductor device of claim 1, wherein the first channel layer has a lower level of Fermi energy than the second channel layer.

9. The semiconductor device of claim 1, wherein the first channel layer has lower bandgap energy than the second channel layer.

10. The semiconductor device of claim 1, wherein a carrier moves in an interface between the first channel layer and the second channel layer.

11. The semiconductor device of claim 1, wherein the first channel layer and the second channel layer have an amorphous phase.

12. The semiconductor device of claim 1, further comprising a gap-fill insulating layer disposed in an opening of the second channel layer.

13. A method of manufacturing a semiconductor device, the method comprising:
    forming a stack structure including first material layers and second material layers that are alternately stacked with each other;
    forming an opening passing through the stack structure;
    forming a first channel layer including a metal oxide-based semiconductor in the opening; and
    forming a second channel layer including the metal oxide-based semiconductor in the first channel layer,
    wherein the first channel layer has a higher oxygen content and a different thickness than the second channel layer.

14. The method of claim 13, wherein the second channel layer has a thickness less than or equal to 5 nm.

15. A semiconductor device, comprising:
    a stack structure including conductive layers and insulating layers that are alternately stacked with each other;
    a channel layer passing through the stack structure;
    a tunnel insulating layer interposed between the channel layer and the stack structure, and including a metal oxide that includes a first metal and a second metal having different magnetic strengths; and
    a data storage layer interposed between the tunnel insulating layer and the stack structure,
    wherein the tunnel insulating layer is a single layer including an inner side portion adjacent to the channel layer and an outer side portion adjacent to the data storage layer, and wherein the outer side portion has a higher concentration of the first metal than the inner side portion and the inner side portion has a higher concentration of the second metal than the outer side portion.

16. The semiconductor device of claim 15, wherein the tunnel insulating layer includes ZrAlO, the first metal is Zr, and the second metal is Al.

17. The semiconductor device of claim 15, wherein the second metal is a stronger magnet than the first metal.

18. The semiconductor device of claim 15, wherein the outer side portion has a lower concentration of the second metal than the inner side portion.

19. The semiconductor device of claim 15, wherein the inner side portion has a lower concentration of the first metal than the outer side portion.

20. A method of manufacturing a semiconductor device, the method comprising:
    forming a stack structure including conductive layers and insulating layers that are alternately stacked with each other;
    forming an opening passing through the stack structure;
    forming a tunnel insulating layer in the opening, the tunnel insulating layer including a metal oxide with a first metal and a second metal with a different magnetic strength from the first metal; and
    forming a channel layer in the tunnel insulating layer,
    wherein the tunnel insulating layer is a single layer including an inner side portion adjacent to the channel layer and an outer side portion adjacent to the stack structure, and
    wherein the outer side portion has a higher concentration of the first metal than the inner side portion and the inner side portion has a higher concentration of the second metal than the outer side portion.

21. The method of claim 20, further comprising:
    performing a magnetic field treatment on the tunnel insulating layer to move the first metal to the outer side portion and to move the second metal to the inner side portion.

22. The method of claim 20, further comprising:
    performing a heat treatment on the tunnel insulating layer to move the first metal to the outer side portion and to move the second metal to the inner side portion.

23. The method of claim 20, wherein the tunnel insulating layer includes ZrAlO, the first metal is Zr, and the second metal is Al.

* * * * *